(12) United States Patent
Hines et al.

(10) Patent No.: US 9,977,930 B2
(45) Date of Patent: May 22, 2018

(54) INTERFERENCE IMMUNE RADIO

(71) Applicant: SENSANNA INCORPORATED, Arnold, MD (US)

(72) Inventors: Andrew T. Hines, Annapolis, MD (US); Jacqueline H. Hines, Annapolis, MD (US)

(73) Assignee: SENSANNA INCORPORATED, Arnold, MD (US)

( * ) Notice: Subject to any disclaimer, the term of this patent is extended or adjusted under 35 U.S.C. 154(b) by 0 days. days.

(21) Appl. No.: 15/205,315

(22) Filed: Jul. 8, 2016

(65) Prior Publication Data

US 2017/0116442 A1    Apr. 27, 2017

Related U.S. Application Data

(60) Provisional application No. 62/189,936, filed on Jul. 8, 2015.

(51) Int. Cl.
*G06K 7/10* (2006.01)
*H04B 17/364* (2015.01)
*H04B 1/00* (2006.01)

(52) U.S. Cl.
CPC ....... *G06K 7/10069* (2013.01); *H04B 1/0007* (2013.01); *H04B 17/364* (2015.01)

(58) Field of Classification Search
CPC ............ G06K 7/0008; G06K 7/10019; G06K 7/10356; G06K 7/10029; G06K 7/10039; G06K 19/0723; G06K 7/10009
USPC ...................................................... 340/10.2
See application file for complete search history.

(56) References Cited

U.S. PATENT DOCUMENTS

| | | | |
|---|---|---|---|
| 6,121,892 A | 9/2000 | Reindl et al. | |
| 7,268,700 B1 * | 9/2007 | Hoffberg | G08G 1/0104 340/539.17 |
| 7,356,343 B2 | 4/2008 | Feher | |
| 8,620,243 B2 * | 12/2013 | Thompson | H04B 1/28 455/130 |
| 9,071,344 B2 * | 6/2015 | Smee | H04B 1/7107 |
| 9,118,111 B2 * | 8/2015 | Naguib | H01Q 3/267 |

(Continued)

OTHER PUBLICATIONS

Lambert, J. A radar interrogator for wireless passive temperature sensing. 2011. [retrieved on Aug. 30, 2016]. Retrieved from the Internet: <URL: http://etd.fcla.edu/CF/CFE0003631/ Lambert_Jeffrey_C_201105_MSEE.pdf>. Entire document.*

(Continued)

*Primary Examiner* — Mark Blouin
(74) *Attorney, Agent, or Firm* — Nixon Peabody LLP; Jeffrey L. Costellia (57) ABSTRACT

An apparatus, system, and method for wireless communication with remote devices that reduce or eliminate interference from zero-mean noise and deterministic signals within the operating system frequency band are provided. An interrogator uses dithering of the initiation time of sequential transmitted signals or sets of transmitted signals with synchronous accumulation of the resulting received signals to reduce the relative strength of interfering signals while increasing the relative strength of the desired signal. The apparatus, system, and method are particularly advantageous when used to extract identification and/or sensor data from passive wireless sensors and tags.

19 Claims, 4 Drawing Sheets

(56) References Cited

U.S. PATENT DOCUMENTS

| | | |
|---|---|---|
| 2006/0192002 A1 | 8/2006 | Forster |
| 2006/0267733 A1 | 11/2006 | Steinke et al. |
| 2010/0060429 A1 | 3/2010 | Hines et al. |
| 2014/0153674 A1* | 6/2014 | Stratigos, Jr. .......... H04L 27/06 375/340 |
| 2014/0167740 A1 | 6/2014 | Gilbert |

OTHER PUBLICATIONS

International Search Report for PCT/US2016/041502 dated Sep. 30, 2016 (1 page).

Written Opinion of International Searching Authority for PCT/US2016/041502 dated Sep. 30, 2016 (5 pages).

Lambert J., "A radar interrogator for wireless passive temperature sensing," 114 pages, 2011, retrieved on Aug. 30, 2016 from <http:etd.fcla.edu/CF/CFE0003631/Lambert_Jeffrey_C_201105_MSEE.pdf>.

Ferrari, et al., "A New Architecture for Wireless Smart Sensor Based on Software Defined Radio," IEEE Transactions on Instrumentation and Measurement 60.6, 28 pages, 2011, retrieved on Aug. 31, 2016 from <https://www.researchgate.net/profile/P_Ferrari/publication/224227387_New_Architecture_for_a_Wireless_Smart_Sensor_Based_on_a_Software-Defined_Radio/links/00b7d5239d98cd390c000000.pdf>.

Vannucci et al., "A Software-Defined Radio System for Backscatter Sensor Networks," IEEE Transactions on Wireless Communications, vol. 7, No. 6, pp. 2170-2179, Jun. 2008, retrieved on Aug. 30, 2016 from <http://alumni.media.mit.edu/~aggelos/papers/twc_june08.pdf>.

International Search Report for PCT/US2016/041504 dated Nov. 10, 2016 (4 pages).

Written Opinion of International Searching Authority for PCT/US2016/041504 dated Nov. 10, 2016 (8 pages).

* cited by examiner

INTERFERENCE IMMUNE RADIO

CROSS-REFERENCE TO RELATED APPLICATIONS

This application claims the benefit of U.S. Provisional Application No. 62/189,936, filed Jul. 8, 2015, herein incorporated by reference in its entirety.

BACKGROUND OF THE INVENTION

Field of the Invention

Embodiments of the present invention relate to apparatuses, systems, devices, and methods for wireless communication with one or more remote devices that reduce or eliminate interference from zero-mean noise and deterministic signals within the system operating frequency band. The apparatuses, systems, devices, and methods are particularly advantageous when used to extract identification and/or sensor data from passive wireless sensors and tags, including those that respond with differential responses at specific delays such as from sets of surface acoustic wave (SAW) based sensor tag devices. In particular, embodiments of the present invention relate to improved methods for implementing an interrogator for said remote devices that uses dithering of the initiation time of sequential transmitted signals, along with synchronous accumulation of the resulting received signals, to cause the interfering signals to be reduced in relative size while increasing the relative strength of the desired signal.

Description of Related Art

Acoustic Wave Sensors: Sensors based on surface-launched acoustic wave devices have been developed since the 1980's for application to physical measurements (temperature, pressure, torque, strain, etc.) and to a wide range of chemical and biological detection problems. These widely varying devices have been described in detail in the open literature, including the following: U.S. Pat. No. 7,268,662, entitled Passive SAW-based hydrogen sensor and system, U.S. Pat. No. 7,434,989, entitled SAW temperature sensor and system, U.S. Pat. No. 7,500,379, entitled Acoustic wave array chemical and biological sensor U.S. Pat. No. 7,791,249, entitled Frequency coded sensors incorporating tapers, U.S. Pat. No. 8,094,008, entitled Coded acoustic wave sensors using time diversity, U.S. Pat. No. 8,441,168, entitled SAW Sensor tags with enhanced performance, U.S. Pat. No. 9,121,754, entitled Surface Acoustic Wave Deposition Monitor for Ultra-Thin Films, U.S. Utility application Ser. No. 13/679,607 (US20130130362A1), entitled Power Spectral Density Chemical and Biological Sensor, and U.S. Utility application Ser. No. 13/694,889 (US20130181573A1), entitled Individually Identifiable Surface Acoustic Wave Sensors, Tags, and Systems.

Acoustic Wave Sensor Interrogation Systems: Acoustic wave sensor devices have been operated within a wide range of wired and wireless interrogation system architectures, which have generally been designed specifically to operate with the selected sensor(s). The system architecture is usually selected based on specific device characteristics and application requirements, and generally involves absolute or differential measurements of sensor frequency, phase, delay, amplitude, or power spectral density, and changes in these quantities with exposure to changes in target parameters, to provide the output sensor measurement.

Conventional wireless interrogation system architectures include pulsed radar-like delay measurement systems, Fourier transform based measurement systems, delay line and resonator-based oscillator systems, and time-integrating correlator based interrogation systems. Radio architectures include conventional homodyne and heterodyne mix-down systems, and direct (to baseband or to near-baseband) conversion systems. A typical down-mixed correlation based radio receiver that uses coherent integration of multiple sweeps to increase signal to noise ratio (S/N) is described by Kozlovski et. al., "A 915 MHz SAW Correlator System," *IEEE Sensors Journal*, Vol. 11, No. 12, December 2011, pp. 3426-3432. This synchronous correlator approach is implemented in a down-mixed software defined radio (SDR) system by Humphries and Malocha, "Software Defined Radio for Passive Sensor Interrogation," Proceedings of the 2013 *IEEE Joint UFFC, EFTF, and PFM Symposium*, 2013, pp. 270-273. Humphries describes modifying a commercially available software defined radio in order to provide for synchronous data accumulation.

Dithering in radar systems and sampled data: Analog-to-digital (A/D) converters (ADCs) have been widely used in electronic systems ranging from military radar to audio and image processing. The process of A/D conversion produces quantization noise, which is often correlated and can produce spectral harmonics that degrade the digitized signal, introducing significant distortion particularly when the signal is small (on the order of the quantization step). As discussed by Thakur et. al., "Utilization of Noise to Enhance the Performance of Radar Signal Processor," $9^{th}$ *International Radar Symposium India*, 2013, adding noise to the signal prior to quantization can randomize the ADC quantization noise, improving overall system performance. This effect has been studied extensively since the early 1960's, and is widely used to provide enhanced system performance for audio systems, image processing, radar, direct down conversion receivers, and numerous other systems. Dithering techniques include addition of noise like signals to the received signal prior to A/D conversion, with the added signal either subtracted out of the digitized signal (subtractive) or not subtracted out (non-subtractive). Additional techniques discussed as dithering in the context of radar electronic counter counter measures (ECCM) include modification of the system transmit properties such as frequency hopping and bandwidth hopping.

SUMMARY OF THE INVENTION

The present invention utilizes a direct to near-baseband subsampled software defined radio (SDR) to directly sample the combined radio frequency (RF) response of a set of remote devices and, in particular, the interrogation of differential response surface acoustic wave (SAW) sensors and sensor-tags, the RF responses of which include a built-in reference signal that is used for comparison when evaluating measured responses, so that devices located at random RF propagation delays can be accurately read. Reduction of zero-mean random electromagnetic noise and asynchronous deterministic signals is achieved through synchronous accumulation of digitized signals, measured from the start of the transmit pulse. The longer the signal accumulation time, the greater the S/N or the better the receiver sensitivity. Deterministic signals within the bandwidth of the receive chain electronics may be digitally sampled and summed, along with the desired sensor signals. This can be a source of interference if such signals exist in the same frequency range as the SAW sensors or sensor-tags, particularly if the timing of the talk/listen cycle happens to result in the undesired deterministic signal being sampled at (or close to) the same phases for each radio interrogation ping. Introduction of a short variable time offset between radio pings—referred to as transmit time dithering—will introduce a phase offset between the resulting deterministic signals received, while not affecting the synchronous nature of the responses accumulated from the differential SAW sensors since timing of these responses is always measured relative to the initiation of the transmitted interrogation pulse. This causes zero-mean deterministic in-band interfering signals to average away in the integration process, like random noise. This allows the negation of the impact of deterministic interfering signals on device readings, with a minimal impact on system cycle times.

Aspects of the present disclosure include a wireless sensor system comprising: one or more acoustic wave sensor or sensor-tag devices; and a software defined radio, wherein the digitized data from a set of N sequential synchronous pulses is summed to produce one output data set, and each said digitized data set is collected according to a process including the steps of: a transmit pulse is generated and transmitted at a specific time, wherein the receive chain is inactive during the transmitted pulse and for a short defined time after completion of the transmit pulse, and the receive chain is switched on at a defined time after the start of the transmitted pulse; data is digitized; digitized data from each received pulse is summed with stored data from prior pulses in said set of N pulses; and a common clock or one or more signals derived therefrom is used to clock the transmit, receive, A/D conversion, and data accumulation processes, which with control signals ensures phase-synchronous operation from pulse to pulse.

Further aspects of the present disclosure include a wireless sensor system comprising: one or more acoustic wave sensor or sensor-tag devices; and a software defined radio utilizing direct to near-baseband subsampling, wherein the digitized data from a set of N sequential synchronous pulses is summed to produce one output data set, and each said digitized data set is collected according to a process including the steps of: a transmit pulse is generated and transmitted at a specific time; the receive chain is inactive during the transmitted pulse and for a short defined time after completion of the transmit pulse; the receive chain is switched on at a defined time after the start of the transmitted pulse; data is digitized; digitized data from each received pulse is summed with stored data from prior pulses in said set of N pulses; and a common clock or one or more signals derived therefrom is used to clock the transmit, receive, A/D conversion, and data accumulation processes, which with control signals ensures phase-synchronous operation from pulse to pulse.

Additional aspects of the present disclosure include a software defined radio utilizing direct to near-baseband subsampling, wherein the digitized data from a set of N sequential synchronous pulses is summed to produce one output data set, and each said digitized data set is collected according to a process including the steps of: a transmit pulse is generated and transmitted at a specific time; the receive chain is inactive during the transmitted pulse and for a short defined time after completion of the transmit pulse; the receive chain is switched on at a defined time after the start of the transmitted pulse; data is digitized; digitized data from each received pulse is summed with stored data from prior pulses in said set of N pulses; and a common clock or one or more signals derived therefrom is used to clock the transmit, receive, A/D conversion, and data accumulation processes, which with control signals ensures phase-synchronous operation from pulse to pulse.

Further aspects of the present disclosure include a software defined radio with enhanced rejection of deterministic in-band interfering signals, wherein the digitized data from a set of N sequential synchronous pulses is summed to produce one output data set, and each said digitized data set is collected according to a process including the steps of: a transmit pulse is generated and transmitted at a specific time; the receive chain is inactive during the transmitted pulse and for a short defined time after completion of the transmit pulse; the receive chain is switched on at a defined time after the start of the transmitted pulse; data is digitized; digitized data from each received pulse is summed with stored data from prior pulses in said set of N pulses; the system waits for a defined delay prior to initiation of the next transmit pulse, said defined delay varying from pulse to pulse; and a common clock or one or more signals derived therefrom is used to clock the transmit, receive, A/D conversion, variable delay, and data accumulation processes, which with control signals ensures phase-synchronous operation from pulse to pulse.

Additional aspects of the present disclosure include a software defined radio with enhanced rejection of deterministic in-band interfering signals, wherein the radio receive chain implements direct to near-baseband subsampling, and the digitized data from a set of N sequential synchronous pulses is summed to produce one output data set, wherein each said digitized data set is collected according to a process including the steps of: a transmit pulse is generated and transmitted at a specific time; the receive chain is inactive during the transmitted pulse and for a short defined time after completion of the transmit pulse; the receive chain is switched on at a defined time after the start of the transmitted pulse; data is digitized; digitized data from each received pulse is summed with stored data from prior pulses in said set of N pulses; the system waits for a defined delay prior to initiation of the next transmit pulse, said defined delay varying from pulse to pulse; and a common clock or one or more signals derived therefrom is used to clock the transmit, receive, A/D conversion, variable delay, and data accumulation processes, which with control signals ensures phase-synchronous operation from pulse to pulse.

Yet additional aspects of the present disclosure include a wireless sensor system comprising: one or more acoustic wave sensor or sensor-tag devices; and a software defined radio with enhanced rejection of deterministic in-band interfering signals, wherein the digitized data from a set of N sequential synchronous pulses is summed to produce one output data set, and each said digitized data set is collected according to a process including the steps of: a transmit pulse is generated and transmitted at a specific time; the receive chain is inactive during the transmitted pulse and for a short defined time after completion of the transmit pulse; the receive chain is switched on at a defined time after the start of the transmitted pulse; data is digitized; digitized data from each received pulse is summed with stored data from prior pulses in said set of N pulses; the system waits for a defined delay prior to initiation of the next transmit pulse, said defined delay varying from pulse to pulse; and a common clock or one or more signals derived therefrom is used to clock the transmit, receive, A/D conversion, variable delay, and data accumulation processes, which with control signals ensures phase-synchronous operation from pulse to pulse.

Further aspects of the present disclosure include a wireless sensor system comprising: one or more acoustic wave sensor or sensor-tag devices; and a software defined radio with enhanced rejection of deterministic in-band interfering signals, wherein the radio receive chain implements direct to near-baseband subsampling, the digitized data from a set of N sequential synchronous pulses is summed to produce one output data set, and each said digitized data set is collected according to a process including the steps of: a transmit pulse is generated and transmitted at a specific time; the receive chain is inactive during the transmitted pulse and for a short defined time after completion of the transmit pulse; the receive chain is switched on at a defined time after the start of the transmitted pulse; data is digitized; digitized data from each received pulse is summed with stored data from prior pulses in said set of N pulses; the system waits for a defined delay prior to initiation of the next transmit pulse, said defined delay varying from pulse to pulse; and a common clock or one or more signals derived therefrom is used to clock the transmit, receive, A/D conversion, variable delay, and data accumulation processes, which with control signals ensures phase-synchronous operation from pulse to pulse.

Additional aspects of the present disclosure include a software defined radio that includes a radio receive chain that implements direct to near-baseband subsampling; a digitized data from a set of N sequential synchronous pulses is summed to produce one output data set; and each said digitized data set is collected according to a process including the steps of: a transmit pulse is generated and transmitted at a specific time; the receive chain is inactive during the transmitted pulse and for a short defined time after completion of the transmit pulse; the receive chain is switched on at a defined time after the start of the transmitted pulse; digitized data is produced by sampling the received signal; digitized data from each received pulse is summed with stored data from prior pulses in said set of N pulses; and wherein a common clock or one or more signals derived therefrom is used to clock the transmit, receive, A/D conversion, and data accumulation processes, which with control signals ensures phase-synchronous operation from pulse to pulse.

Yet additional aspects of the present disclosure include a software defined radio having enhanced rejection of deterministic in-band interfering signals wherein the digitized data from a set of N sequential synchronous pulses is summed to produce one output data set; and wherein each said digitized data set is collected according to a process including the steps of: a transmit pulse is generated and transmitted at a specific time; the receive chain is inactive during the transmitted pulse and for a short defined time after completion of the transmit pulse; the receive chain is switched on at a defined time after the start of the transmitted pulse; digitized data is produced by sampling the received signal; digitized data from each received pulse is summed with stored data from prior pulses in said set of N pulses; the system waits for a defined delay prior to initiation of the next transmit pulse, said defined delay varying from pulse to pulse; and wherein a common clock or one or more signals derived therefrom is used to clock the transmit, receive, A/D conversion, variable delay, and data accumulation processes, which with control signals ensures phase-synchronous operation from pulse to pulse.

Further aspects of the present disclosure include a wireless sensor system comprising: one or more acoustic wave sensor or sensor-tag devices; and a software defined radio, wherein the digitized data from a set of N sequential synchronous pulses is summed to produce one output data set, and each said digitized data set is collected according to a process including the steps of: a transmit pulse is generated and transmitted at a specific time; the receive chain is inactive during the transmitted pulse and for a short defined time after completion of the transmit pulse; the receive chain is switched on at a defined time after the start of the transmitted pulse; digitized data is produced by sampling the received signal; digitized data from each received pulse is summed with stored data from prior pulses in said set of N pulses; and wherein a common clock or one or more signals derived therefrom is used to clock the transmit, receive, A/D conversion, and data accumulation processes, which with control signals ensures phase-synchronous operation from pulse to pulse.

Still other aspects, features, and advantages of the present invention are apparent from the following detailed description, simply by illustrating exemplary embodiments and implementations, including the best mode contemplated for carrying out the present invention. The present invention also is capable of other and different embodiments, and its several details can be modified in various respects, all without departing from the spirit and scope of the present invention. Accordingly, the drawings and descriptions are to be regarded as illustrative in nature, and not as restrictive.

BRIEF DESCRIPTION OF THE DRAWINGS

The present invention will be understood more fully from the detailed description given below and from the accompanying figures and drawings of various embodiments of the invention, which, however, should not be taken to limit the invention to the specific embodiments, but are for explanation and understanding only.

DETAILED DESCRIPTION OF THE INVENTION

Embodiments of the present invention teach apparatuses, systems, devices, and methods for eliminating or reducing the interference caused by both zero-mean random signals and zero-mean deterministic signals that are in the same frequency band as the sensor response signals of interest.

Aspects of the present invention include a software defined radio system, which is a direct to near-baseband subsampled radio that uses a series of repeated pings to interrogate devices, synchronously accumulating the returned signal to enhance the signal strength and to drive down the noise level. This process eliminates or reduces interference from zero-mean random noise. Summation causes the deterministic signal strength to increase faster than the noise, while averaging maintains the signal strength of the deterministic signal, and the noise tends towards zero as the number of data sets aggregated increases. This process also eliminates or reduces interference from deterministic zero-mean signals, provided that the total time from the start of one radio interrogation 'ping' to the start of data accumulation is not an integer multiple of the cycle time of the interfering signal's carrier frequency—which ensures the signal arrives at different phases on successive pings, averaging to zero over multiple pings. In an analog to digital (A/D) converter (ADC), sampling of a zero-mean signal can result in a digitized data set that is all positive, with values ranging from zero to a maximum value determined by the system parameters used. In such a system, a signal with value of zero will generally appear at or near the midpoint of the ADC output value scale. Thus, reference herein to "average to zero" or "accumulate to zero" or "sum to zero" refers to the process by which zero mean signals sampled at random relative phases will add to produce, over time, a value in the field-programmable gate array (FPGA) or other data accumulation device an output that corresponds to the value that would be produced for a zero value input signal. Other processing units, such as microprocessors, programmable logic devices (PLDs), among others can be used in place of an FPGA to perform some or all of the functions discussed herein. Accumulating (or summing) means that the synchronously collected sampled data is being added, so that the longer the accumulation time the larger the data values become—which also means the accumulated data value that would correspond to a signal of level zero increases. Averaging, by comparison, means that the accumulated data is divided by the number of radio pings from which the data was gathered. This process produces data that is lower in value.

S/N is enhanced substantially through accumulation (with or without averaging), which currently is performed by the FPGA that also generates the transmit (Tx) signal. A noise-like Tx signal can be used; in one current system embodiment a PN code that is broadband relative to each SAW sensor or sensor-tag is used, which activates all sensor devices in the field of view. This broadband signal is filtered prior to transmission to meet regulatory requirements. Narrowband activation signals can also be used, or dispersive (chirp or other) signals can be used, or signals coded to preferentially activate selected devices (based on frequency, coding, chirp, or other characteristics) if desired.

Figure 1:
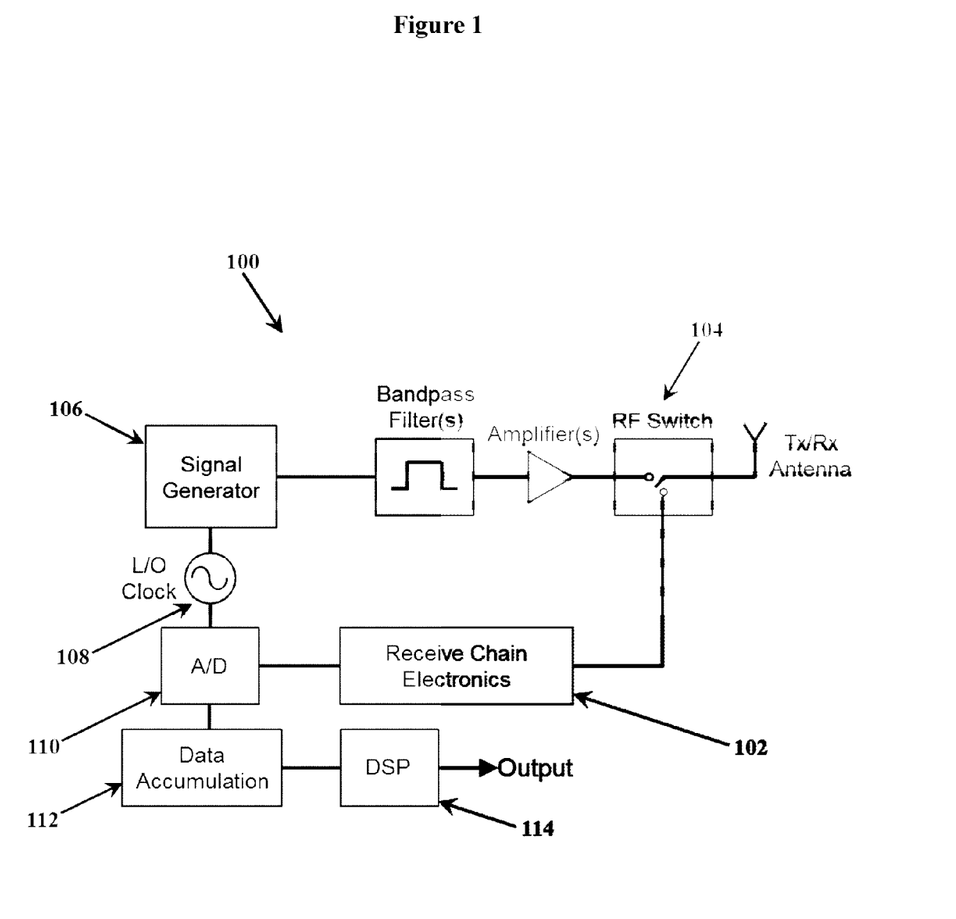
FIG. 1 shows a block diagram of a radio interrogation system architecture according to aspects of the present disclosure.

FIG. 1 shows a block diagram of a radio system architecture (radio) 100 without added time dithering of the transmitted signal, according to aspects of the present disclosure. This system architecture 100 can be a direct to near-baseband subsampled radio as a preferred embodiment, or it may be a more conventional mixed-down radio. The radio 100 operates in a 'talk' then 'listen' mode, where the receive (Rx) chain circuitry 102 is not active during the Tx pulse and for a set time after the Tx pulse is complete (to protect the sensitive receive chain circuitry from damage), and then the Rx circuitry turns on and 'listens' or acquires data for a defined period, which for SAW sensors is generally much longer than the transmit pulse length. A high isolation RF switch 104 is used to control the Tx/Rx cycle, with switch timing provided by the signal generator unit 106, so the 'listen' portion of the cycle starts at a known time relative to the 'talk' portion of the cycle. The precise timing of the system pings and the 'talk' and 'listen' portions of the operation cycle is important. If time zero is when the ping that activates the sensors starts, and the ping lasts for a defined time (the Tx time), there is a subsequent short wait time for the RF clutter caused by the transmitted ping bouncing off objects in the environment to clear. By way of example, for a nominally ~200 nsec Tx pulse, the short wait time can be as much as 1 µsec. Then, the Rx chain turns on and the system begins to accumulate digitized data, which includes data from the sensors (desired) as well as noise and also interference from deterministic signals in the environment that are within the operating frequency range of the radio receiver. For conditions in which the SAW sensor position relative to the interrogator antenna and the sensor environment are not changing rapidly (i.e., the sensor position and the measurand are not changing substantially within the timeframe of the measurement cycle), the delay (and the phase) of the returning signals from each sensor will be identical from ping to ping, allowing synchronous accumulation of sensor data. To aid the synchronous accumulation, a single low-jitter clock 108 (or local oscillator, LO) or one or more signals derived therefrom is used to clock the signal generator unit 106 (e.g., FPGA), the control circuit timing counter keeping track of the talk/wait/listen cycle, the receive chain A/D converter 110, and the data accumulator 112. Thus, the carrier for the transmitted signal always starts at a known phase relative to the clock (for each ping), and each sensor signal response arrives at the A/D converter at a known delay and phase for each ping. Different sensors operating in a group will have signals arriving at arbitrary and potentially different RF delays based on their physical positions relative to the Tx/Rx antenna, and due to varying conditions in their environments causing changes in acoustic delay, and due to device design. But as long as the same clock or one or more signals derived therefrom is used as described, the deterministic signals from each sensor will add while the zero-mean random noise signals (and zero-mean deterministic signals that are sampled at differing phases from ping to ping) will sum to zero with accumulation of an increased number of pings.

Figure 2:
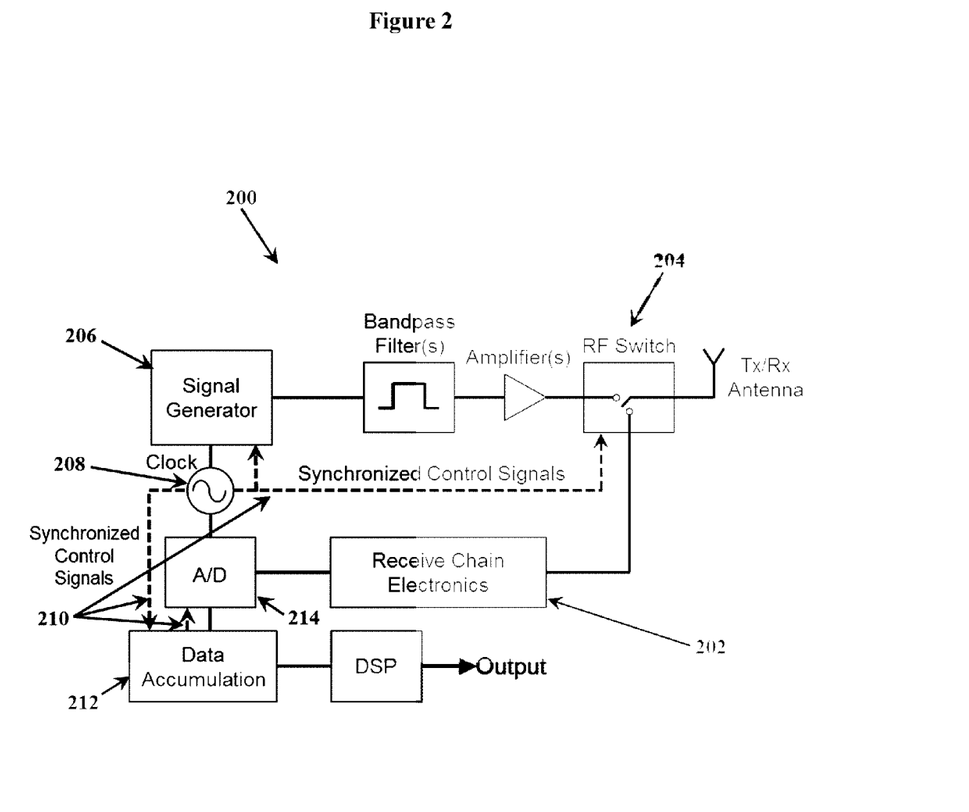
FIG. 2 shows another block diagram of a radio interrogation system architecture according to aspects of the present disclosure.

FIG. 2 shows another block diagram of a radio system architecture (radio) 200 without added time dithering of the transmitted signal, according to aspects of the present disclosure. Control signals synchronized to the clock or one or more signals derived therefrom are used to time the transmit (Tx)/receive (Rx) switch, and to time the data accumulation process. These control signals ensure that on each cycle, the signal transmission starts with the clock signal at a set phase, the transmit signal lasts for a predefined time period, and there is a defined time gap between the Tx signal being turned off and the data accumulation starting in the ADC. This ensures phase synchronous accumulation of the desired signal. Similar to what is disclosed above, the radio 200 operates in a 'talk' then 'listen' mode, where the receive (Rx) chain circuitry 202 is not active during the Tx pulse and for a set time after the Tx pulse is complete, then the Rx circuitry turns on and 'listens' or acquires data for a defined period, which for SAW sensors is generally much longer than the transmit pulse length. A high isolation RF switch 204 is again used to control the Tx/Rx cycle, with switch timing provided by synchronized control signals 210 that also control the signal generator unit 206, so that the 'listen' portion of the cycle starts at a precise known time relative to the 'talk' portion of the cycle. Also similar to what is disclosed above, the signal generator unit 206, the control circuit timing counter keeping track of the talk/wait/listen cycle responsible for generation of the synchronized control signals 210, the receive chain A/D converter 214, and the data accumulator 212 are all synchronized based upon a common clock 208 and/or derivative signals therefrom. Operation of this system is the same as that of FIG. 1.

Due to possible limits in the internal memory allocation choices, the number of pings that can be summed in the allocated space in the FPGA can be limited, based on the maximum amplitude of the sensor signal. For example, a 32-bit register can hold a larger number of pings (which may be on the order of 65,000 for typical sensor signal amplitudes and A/D input voltage ranges) than can a 16-bit register (which can only hold 6 pings or so for typical sensor signal amplitudes and A/D input voltage ranges). Thus, for certain system implementations, if more than about 6 pings are summed, the resulting number will be larger than can be stored in the lowest 16 bits of a 32-bit register. However, as allocation of memory in the FPGA can be controlled, it is possible to set the storage size large enough to allow for accumulation of a signal to the desired S/N. The impact of accumulation on output data rate must be taken into account.

After a set of time data points is aggregated in the system, the data is transferred to an internal processing portion of the system (114 in FIG. 1) or to an external device such as a computer (if desired) for digital signal processing and analysis. Transfer of data may be limited by the capacity of the transfer device, be it USB or other.

Once data is accumulated from a set number of 'pings', which can be considered one "data set," additional enhancement in signal level and in S/N can be achieved by integrating the responses from multiple data sets received in the signal processing device (which can be external, as a computer, or on board as in a microprocessor or similar device). Integration, or synchronous accumulation, will cause the signal level to continue to increase, while driving noise from random zero-mean signals further down relative to the signal of interest, increasing S/N.

It should be noted that the receive chain electronics can be implemented in a number of ways that are well known in the prior art of radio technology and of software defined radio technology. These include a pure near-baseband subsampled receiver approach, direct down-conversion, and homodyne or heterodyne mixed-down architectures.

The receive chain of a subsampling radio consists of assorted components, which can include switches, filters, amplifiers, and attenuators. The received signal is processed by these components, and then is directly sampled by the A/D converter, at a rate that is well below Nyquist for the signals of interest. Sampling at a frequency of $F_s$ will mirror image signal content (left/right) around $F_s/2$. But provided the signal of interest is bandlimited and is fully contained within a defined frequency region that is an integer multiple of the near baseband sampled region (DC to $F_s/2$), an image of the desired signal (possibly mirrored left-right depending on which Nyquist zone the signal started in) will be detected in the near baseband sampled region. Knowing the Nyquist zone from which the signal came will allow the precise reconstruction of the original (higher frequency) signal.

Conventional down-mixed radio receive chains can also be used. In such systems, RF signals are mixed with other single frequency signals to create image frequency signals at lower frequencies. The RF signal can be mixed down one or more times, to one or more intermediate frequencies (IFs), but the final down-mixing generally places the signal in a baseband or near-baseband frequency range where it can be sampled at above Nyquist frequencies. Filtering, amplification, and attenuation can also be used where needed in the receive chain circuitry.

Method for eliminating interference from deterministic signals: Signals present in the environment of the SAW sensor system that are deterministic and within the bandwidth of the receiver chain circuitry will be sampled along with the SAW sensor/tag response signals, and may introduce interference. If the timing of the talk/listen cycle happens to result in the undesired deterministic signal being sampled at different phases on sequential pings, then the sampled signal will be accumulated with data from each talk/listen cycle adding to data from prior pings, with data from each ping adding at different phases. This results in a reduction in amplitude of the undesired deterministic signal if it is a zero mean signal. The precise phase relationship of the sampled undesired signal from ping to ping will determine how effectively cancellation of the undesired signal occurs for any given number of pings.

The problem becomes worse when the periodicity of the interfering signal places it at or close to the same phase for each sample sweep of our radio. In such a circumstance, the high sensitivity receiver will accumulate the undesired deterministic signal along with the desired sensor signal, which can produce detrimental interference that prevents proper reading of the sensors. This can occur, for example, when the system is operating in the presence of other wireless systems within the same ISM band. But interference from such signals can be eliminated in the present invention by deliberately jittering the timing of the transmitted (and hence the received sensor) signal for sequential pings. By adding in a short, variable time delay before transmitting each ping of the radios described herein—which is referred to as transmit time dithering—the relative phase of interfering signals run to run can be altered, and as a result cause them to become relatively smaller (as compared to the desired signals) in the integration process, like random noise. The added delay can be random, or a deterministic changing time delay of known characteristics. This allows for the negation of the impact of deterministic interfering signals on device readings, with a minimal impact on system cycle times. The time between the start of each ping and the start of sampling of the received signal can be the same for each talk/wait/listen cycle, but due to the undesired signal being independent of the sensor system signal, if the Tx ping is sent out when the deterministic signal is at different phases on subsequent pings, the received signal from the undesired deterministic signal will also be at different phases. Unlike interfering signals, the SAW devices respond at a defined time relative to the start of each transmit ping, and so accumulation of the SAW response will remain synchronous (in phase) no matter what the delay is between the end of one listen cycle and the start of another ping.

For practical implementations, the delay offsets between sequential pings can be quite small, potentially as small as on the order of several nanoseconds or less, causing only a small impact on the overall system data rate. While this may correspond to a large number of degrees of phase at the carrier frequency of the interfering electromagnetic signal (for example, at 915 MHz, a full cycle of 360 degrees of phase takes only 1.093 nanoseconds), this simply means that one or more cycles of the carrier of the undesired interfering signal will be 'missed' prior to the next radio ping being initiated. Provided each ping starts at a differing carrier phase (of the undesired signal), this transmit signal dithering will result in received data that samples and accumulates data from the undesired signal at varying phases.

Generation of a random or pseudo-random sequence, preferably one that is long relative to the number of pings accumulated, can be performed and the resulting sequence can be used to modulate the length of the 'wait' period between the end of one 'listen' period and the start of the next 'talk' signal or ping. One simple implementation could have the random delay controlled by the same clock as that controlling the transmission of pings and the start of the receive cycle, although this is not necessary in order to retain synchronism of the received SAW sensor response signals.

The apparatuses, systems, and devices can be designed to automatically assess either the incoming (raw) signal or the extracted data to determine if interference is occurring and then apply jittering to subsequent measurements. In addition to random delays, the apparatuses, systems, and devices could use constant delay additions to simply shift the phase of an interfering signal run to run. Variable deterministic pre-defined delay additions that are not constant from run to run could also be used. A system can be programmed to test a variety of interference rejection schema and select to use the scheme that produces the best interference rejection or sensor S/N.

Figure 3:
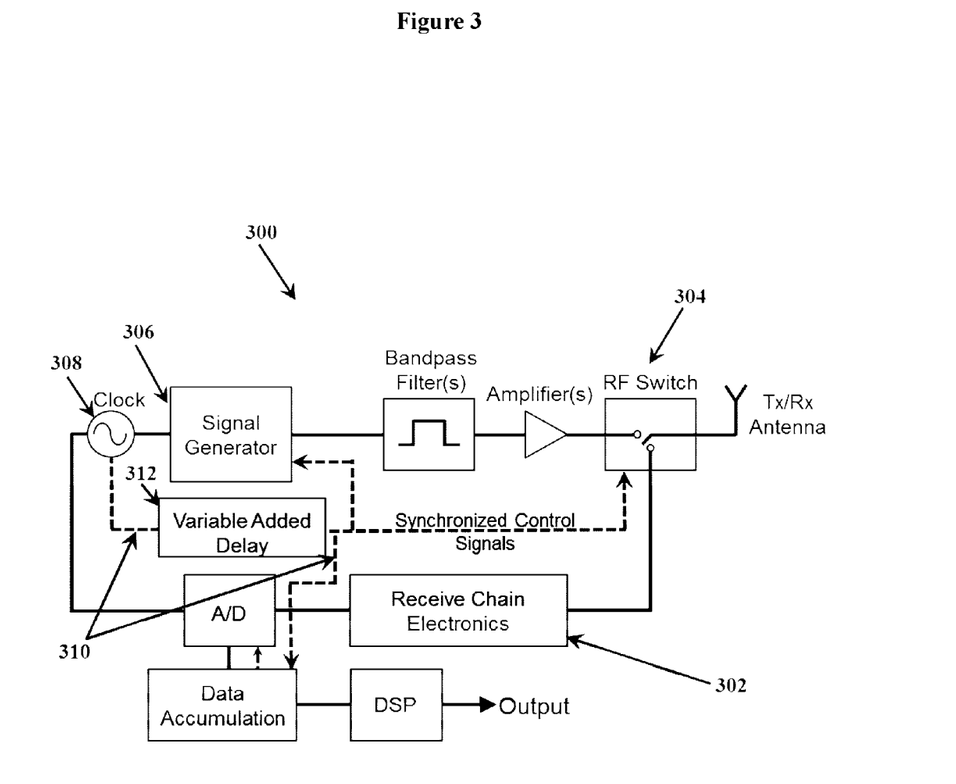
FIG. 3 shows another block diagram of an interrogation system architecture according to aspects of the present disclosure.

FIG. 3 shows another block diagram of a radio system architecture (radio 300) with added time dithering of the transmitted signal, according to aspects of the present disclosure. Control signals synchronized to the clock or one or more signals derived therefrom are used to delay the timing of signal generation, switching of the transmit/receive (Tx/Rx) switch, and the start of data accumulation after a defined added delay that varies between radio pings or sets of radio pings. This randomizes the phase at which any signals other than those produced by the sensors of interest are received, causing zero-mean signals to average out to zero or accumulate to zero as data from multiple radio pings is accumulated. The radio 300 again operates in a 'talk' then 'listen' mode, where the receive (Rx) chain circuitry 302 is not active during the Tx pulse and for a set time after the Tx pulse is complete, then the Rx circuitry turns on and 'listens' or acquires data for a defined period. A high isolation RF switch 304 is again used to control the Tx/Rx cycle, with switch timing provided by synchronized control signals 310 such that the 'listen' portion of the cycle starts at a precise known time relative to the 'talk' portion of the cycle. As discussed above, the signal generation unit 306, the control circuit timing counter keeping track of the talk/wait/listen cycle responsible for generation of the synchronized control signals 310, the receive chain A/D converter 314, and the data accumulator 312 are all synchronized to a single low-jitter clock 308 and derivative signals therefrom. However, in the radio 300, an added time delay 312 is introduced between the end of one talk/listen cycle and the start of the next talk/listen cycle. This added delay 312 is variable from cycle to cycle; i.e., there is a small, changing time delay after the end of each measurement cycle before initiation of a radio ping at the start of the next cycle. Variation in the added delay 312 can be random or deterministic, and the timing of the added delay is generally synchronized to the clock 308 or derivative signals therefrom, although this is not strictly necessary for proper system operation. Provided the system talk/listen cycle operates in a phase synchronous manner relative to the clock 308 or derivative signals therefrom, the variable delay between the completion of one cycle and the start of the next can theoretically be arbitrary.

Rapid sampling using SAW sensors and sensor-tags: SAW wireless sensor systems (radio interrogator and set of sensors) according to aspects of the present disclosure operate on a "talk" then "listen" cycle that may take on the order of 10 µsec to complete ($10^{-5}$ seconds). Thus, the fundamental maximum sampling rate of such a system is given by 1/(10 µsec)=100 kHz. This rate is dependent primarily on the acoustic delay designed into the SAW sensors or tags. Hence, reducing the acoustic delay time to, for example, 2 µsec, could increase the sampling rate to 500 kHz. Using a similar system with resonator-based SAW devices, which have near-zero (or very short, on the order of nanosecond) acoustic delays and then ring down over a microsecond or more, could potentially decrease the sample time to 1 µsec or less, enabling data rates of ~1 MHz. However, interference between resonator signals that continue to ring down from one radio talk/listen cycle with future responses may be problematic. Another SAW device structure that can be used for rapid sampling is the notch sensor, where two acoustic signals at slightly differing delays are produced, and the beating of these two signals generates a frequency domain response consisting of a passband containing one or more notches. The built-in delay of notch devices can be significantly smaller than traditional differential delay lines, and these devices do not suffer from ling ringing responses as do resonant devices. It should be noted that both resonant devices and notch filters with very short acoustic delays can suffer from interference due to reflected multipath of the transmitted RF pulse, although pedestal delays can be designed into certain devices in order to reduce this problem.

The signal to noise ratio (S/N) for a single radio ping may not be sufficiently high to provide good sensor data. Synchronous data accumulation and/or averaging can be used (as described above) to enhance S/N. Synchronous accumulation (summing) enhances S/N by integrating the desired deterministic sensor signal, producing a higher signal level, while also summing the zero mean undesired signals (noise and deterministic signals when transmit time dithering according to the present invention is applied) to produce interference signals that are smaller relative to the summed desired signal. Averaging, which divides the summed data by the number of responses summed, enhances S/N by maintaining the desired deterministic sensor signal, while averaging zero mean noise sources (and with the present transmit time dithering invention described above unwanted deterministic signals as well) to produce smaller interfering signal levels.

Figure 4:
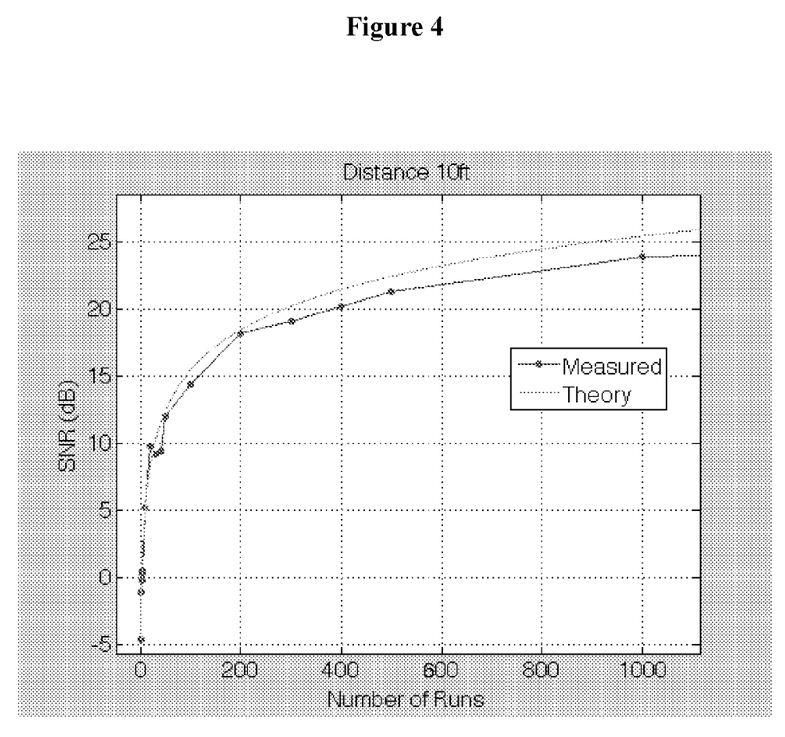
FIG. 4 shows an example of the theoretical improvement in S/N compared to the measured S/N for a wireless SAW sensor operating at a distance of 10 ft. from the transceiver antenna according to aspects of the present disclosure.

Whether accumulation or averaging is used, summing of pings impacts the achievable output data rate for the system. For example, accumulation of the response from 10 'pings' that are each 10 µsec long would produce a data rate of 10 kHz while accumulation of the response from 100 'pings' would result in a 1 kHz data rate. The S/N will increase as the number of ping responses accumulated increases, for any given transceiver antenna to sensor antenna separation. An example of the theoretical improvement in S/N compared to the measured S/N for a wireless SAW sensor operating at a distance of 10 ft. from the transceiver antenna is shown in FIG. 4. Note that for 100 run accumulation, S/N is over 13 dB, indicating that a 1 kHz data rate is feasible for this sensor at 10 ft. Lower loss sensors and reduced antenna losses would all contribute to higher S/N for a given separation.

As previously stated, after a set of data is aggregated in the system, the data is transferred to a processing device, either internal to the system or an external device, such as an external computer, for digital signal processing and analysis. Transfer of data may be limited by the capacity of the transfer interface, such as universal serial bus (USB) or other. Hence, it is advantageous to reduce the amount of data to be transferred as much as possible, while retaining the information necessary to extract sensor measurements. When a differential delay type sensor implementation is used, there are regions of the time signal that can be considered 'useful data' and regions that are considered 'dead space' where the signal of interest is not present. To improve data processing speed and to reduce the time taken to transfer a data set, one or more particular sections of the time response can be selected for transfer and use, discarding or ignoring data in the dead space around these useful data sections.

Other considerations: The software defined radio system according to this invention can use a range of transmit pulse types, including narrowband and spread spectrum pulses. Noise-like and chirped spread spectrum signals can be used to advantage with certain sensor embodiments. According to one software defined radio embodiment according to aspects of the present disclosure, an averaging or data accumulation process is performed over multiple pseudo-noise (PN) code interrogation sequences, increasing signal to noise ratio and pulling low spread spectrum sensor signals out of the system noise. The received combined signal is sampled (either at RF or using subsampling), accumulated, and then correlated with the reference response appropriate for each sensor. Data post-processing enables extraction of the identification, response, and distance from the reader of each sensor.

This radio (also known as the interrogator or reader) system utilizes the correlation properties of the sensor codes to identify sensor devices with specific codes (where chirp coding, direct sequence spread spectrum (DSSS) coding, or other known coding techniques can be used), along with the time and frequency diversity of the devices to identify and read specific sensors. In addition, processing gain can be built into the sensors using chirp SAW elements.

The application of the transmit signal time dithering techniques taught herein has focused on producing software defined radio systems suitable for eliminating the impact of in-band interfering signals (noise and deterministic signals) to allow accurate reading of sets of one or more SAW sensor or sensor-tag devices. However, the utility of this technique would extend to any wireless communication system that involves detection and reception of response signals that have a known delay relative to the transmitted signal, or where the delay of the desired signal does not change much over the time required for data accumulation to effectively reduce interfering signal levels. This technique can be used with general transmitted signals—i.e., it is not restricted to electromagnetic signals, but can be used with acoustic and other types of wireless signals. Systems and other applications that could potentially benefit from application of the techniques and embodiments of the present invention including this type of dithering include radar, sonar, ultrasonic, optical, imaging, and other reflective signal systems where the device(s) or object(s) to be detected are not moving or changing rapidly relative to the system sample rate (which depends on the time required for data accumulation). The focus on implementations of SAW sensor interrogation systems utilizing this invention is not intended to be restrictive, as other applications would benefit from these techniques as well.

The illustrations included herein are exemplary in nature, and do not encompass all aspects of the present invention. One skilled in the art would recognize that the improvements provided by embodiments of this invention can be implemented for radio system architectures that utilize a range of receive chain structures, including direct to baseband conversion, near-baseband subsampling (as in the preferred embodiment), and conventional down-mixing prior to A/D conversion.

One skilled in the art would also recognize that the improvements provided by embodiments of this invention can be implemented to work with any of a wide range of known SAW sensor and sensor-tag structures, including but not limited to those incorporating various diversity techniques (code, chirp, time, and frequency diversity among others).

Other implementations of the invention will be apparent to those skilled in the art from consideration of the specification and practice of the invention disclosed herein. Various aspects and/or components of the described embodiments may be used singly or in any combination. It is intended that the specification and examples be considered as exemplary only, with a true scope and spirit of the invention being indicated by the following claims.

What is claimed is:

1. A software defined radio:
   wherein the radio receive chain implements direct to near-baseband subsampling; and
   wherein the digitized data from a set of N sequential synchronous pulses is summed to produce one output data set; and
   wherein each said digitized data set is collected according to a process including the steps of:
      a transmit pulse is generated and transmitted at a specific time;
      the receive chain is inactive during the transmitted pulse and for a short defined time after completion of the transmit pulse;
      the receive chain is switched on at a defined time after the start of the transmitted pulse;
      digitized data is produced by sampling the received signal;
      digitized data from each received pulse is summed with stored data from prior pulses in said set of N pulses; and
      wherein a common clock or one or more signals derived therefrom is used to clock the transmit, receive, A/D conversion, and data accumulation processes, which with control signals ensures phase-synchronous operation from pulse to pulse.

2. The software defined radio of claim 1, further comprising enhanced rejection of deterministic in-band interfering signals;
   wherein the process used to collect each said digitized data further includes the step of time dithering of the transmit signal;
   wherein after summing of the digitized data from each pulse, the system waits for a defined delay prior to initiation of the next transmit pulse, said defined delay varying from pulse to pulse; and
      wherein a common clock or one or more signals derived therefrom is used to clock the transmit, receive, A/D conversion, variable delay, and data accumulation processes, which with control signals ensures phase-synchronous operation from pulse to pulse.

3. The software defined radio of claim 1, further comprising averaging of the digitized data set;
   wherein the process used to collect each said digitized data further includes the step of dividing the collected data set by the number of pulses N.

4. The software defined radio having enhanced rejection of deterministic in-band interfering signals of claim 2, further comprising averaging of the digitized data set;
   wherein the process used to collect each said digitized data further includes the step of dividing the collected data set by the number of pulses N.

5. A software defined radio having enhanced rejection of deterministic in-band interfering signals;
   wherein the digitized data from a set of N sequential synchronous pulses is summed to produce one output data set; and
   wherein each said digitized data set is collected according to a process including the steps of:
      a transmit pulse is generated and transmitted at a specific time;

the receive chain is inactive during the transmitted pulse and for a short defined time after completion of the transmit pulse;

the receive chain is switched on at a defined time after the start of the transmitted pulse;

digitized data is produced by sampling the received signal;

digitized data from each received pulse is summed with stored data from prior pulses in said set of N pulses;

the system waits for a defined delay prior to initiation of the next transmit pulse, said defined delay varying from pulse to pulse; and wherein a common clock or one or more signals derived therefrom is used to clock the transmit, receive, A/D conversion, variable delay, and data accumulation processes, which with control signals ensures phase-synchronous operation from pulse to pulse.

6. The software defined radio having enhanced rejection of deterministic in-band interfering signals of claim 5, further comprising averaging of the digitized data set;

wherein the process used to collect each said digitized data further includes the step of dividing the collected data set by the number of pulses N.

7. A wireless sensor system comprising:
one or more acoustic wave sensor or sensor-tag devices; and
a software defined radio according to claim 1.

8. A wireless sensor system comprising:
one or more acoustic wave sensor or sensor-tag devices; and
a software defined radio according to claim 2.

9. A wireless sensor system comprising:
one or more acoustic wave sensor or sensor-tag devices; and
a software defined radio according to claim 3.

10. A wireless sensor system comprising:
one or more acoustic wave sensor or sensor-tag devices; and
a software defined radio according to claim 4.

11. A wireless sensor system comprising:
one or more acoustic wave sensor or sensor-tag devices; and
a software defined radio according to claim 5.

12. A wireless sensor system comprising:
one or more acoustic wave sensor or sensor-tag devices; and
a software defined radio according to claim 6.

13. A wireless sensor system as in claim 7, further comprising:
a means to transfer to a signal processing device only selected portions of the total data response selected, thereby reducing the total data transfer time required and increasing the system data output rate.

14. A wireless sensor system as in claim 8, further comprising:
a means to transfer to a signal processing device only selected portions of the total data response selected, thereby reducing the total data transfer time required and increasing the system data output rate.

15. A wireless sensor system as in claim 9, further comprising:
a means to transfer to a signal processing device only selected portions of the total data response selected, thereby reducing the total data transfer time required and increasing the system data output rate.

16. A wireless sensor system as in claim 10, further comprising:
a means to transfer to a signal processing device only selected portions of the total data response selected, thereby reducing the total data transfer time required and increasing the system data output rate.

17. A wireless sensor system as in claim 11, further comprising:
a means to transfer to a signal processing device only selected portions of the total data response selected, thereby reducing the total data transfer time required and increasing the system data output rate.

18. A wireless sensor system as in claim 12, further comprising:
a means to transfer to a signal processing device only selected portions of the total data response selected, thereby reducing the total data transfer time required and increasing the system data output rate.

19. A wireless sensor system comprising:
one or more acoustic wave sensor or sensor-tag devices; and
a software defined radio:
wherein the digitized data from a set of N sequential synchronous pulses is summed to produce one output data set; and
wherein each said digitized data set is collected according to a process including the steps of:
a transmit pulse is generated and transmitted at a specific time;
the receive chain is inactive during the transmitted pulse and for a short defined time after completion of the transmit pulse;
the receive chain is switched on at a defined time after the start of the transmitted pulse;
digitized data is produced by sampling the received signal;
digitized data from each received pulse is summed with stored data from prior pulses in said set of N pulses; and
wherein a common clock or one or more signals derived therefrom is used to clock the transmit, receive, A/D conversion, and data accumulation processes, which with control signals ensures phase-synchronous operation from pulse to pulse.

* * * * *